(12) United States Patent
Eldridge

(10) Patent No.: US 10,598,697 B2
(45) Date of Patent: Mar. 24, 2020

(54) SHIELDING FOR VERTICAL PROBE HEADS

(71) Applicant: FormFactor, Inc., Livermore, CA (US)

(72) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 15/868,737

(22) Filed: Jan. 11, 2018

(65) Prior Publication Data
US 2018/0196086 A1    Jul. 12, 2018

Related U.S. Application Data

(60) Provisional application No. 62/445,607, filed on Jan. 12, 2017.

(51) Int. Cl.
G01R 1/073    (2006.01)

(52) U.S. Cl.
CPC ..... G01R 1/07307 (2013.01); G01R 1/07314 (2013.01)

(58) Field of Classification Search
CPC combination set(s) only.
See application file for complete search history.

(56) References Cited

U.S. PATENT DOCUMENTS

| | | | |
|---|---|---|---|
| 6,259,260 B1 * | 7/2001 | Smith | G01R 31/2886 324/756.05 |
| 6,844,748 B2 | 1/2005 | Sato et al. | |
| 2009/0224785 A1 | 9/2009 | Breinlinger et al. | |
| 2010/0164519 A1 | 7/2010 | Sellathamby et al. | |
| 2010/0176832 A1 * | 7/2010 | Kister | G01R 1/07314 324/756.07 |
| 2011/0050267 A1 | 3/2011 | Pagani | |
| 2013/0257467 A1 * | 10/2013 | Tomioka | G01R 1/0466 324/750.25 |
| 2014/0197860 A1 * | 7/2014 | Hsu | G01R 1/07357 324/756.07 |
| 2015/0015289 A1 | 1/2015 | Eldridge | |
| 2015/0115989 A1 | 4/2015 | Okada et al. | |
| 2015/0192608 A1 * | 7/2015 | Hsu | G01R 1/07371 324/755.09 |
| 2015/0280345 A1 * | 10/2015 | Kimura | H01R 13/2428 439/700 |
| 2017/0242057 A1 * | 8/2017 | Mori | G01R 1/07357 |

* cited by examiner

*Primary Examiner* — Huy Q Phan
*Assistant Examiner* — Adam S Clarke
(74) *Attorney, Agent, or Firm* — Lumen Patent Firm

(57) ABSTRACT

Crosstalk between probes in a vertical probe array is reduced by providing a grounded metal carrier disposed between the guide plates of the probe array. The metal carrier includes pockets that are laterally separated from each other by the metal carrier. Probes in different pockets are thereby electrically shielded from each other.

9 Claims, 4 Drawing Sheets

SHIELDING FOR VERTICAL PROBE HEADS

CROSS REFERENCE TO RELATED APPLICATIONS

This application claims the benefit of U.S. provisional patent application 62/445,607, filed on Jan. 12, 2017, and hereby incorporated by reference in its entirety.

FIELD OF THE INVENTION

This invention relates to probe arrays for testing electrical circuits.

BACKGROUND

Vertical probes configured as a probe array are often used for testing electrical devices and circuits. One common configuration for such a probe array is to use guide plates for the probes to determine where the top and bottom of each probe will be located. Controlling the positions of the probes in this manner provides precise control of probe locations and thereby enables arrays of closely spaced probes to be employed.

In some cases, the device under test operates at a sufficiently high frequency that crosstalk from probe to probe in such a probe array can become a significant and undesirable problem. Reducing the crosstalk by spacing the probes further apart is usually not an option because the spacing of probes in the probe array is typically fixed by the spacing of the contacts on the device under test. Accordingly, it would be an advance in the art to reduce crosstalk in such probe arrays.

SUMMARY

In this work, crosstalk is reduced between probes in a vertical probe array by disposing a metal carrier that has two or more pockets between the guide plates. The pockets are holes that go all the way through the metal carrier, and the metal carrier itself is grounded. As a result, probes passing through different pockets are further isolated from each other by the intervening ground plane provided by the metal carrier. Grounding of the metal carrier is preferably accomplished as close as practical to the signal probes that need to be isolated.

Any arrangement of pockets in the metal carrier can be employed. Options include: one pocket for each probe, or grouping the probes into pockets as dictated by proximity of probes to each other and/or by which probes really need to be further isolated from each other. The guide plates can be metal guide plates or they can be insulating guide plates. In cases where metal guide plates are used, some of the probes can be allowed to make electrical contact to the guide plate (e.g., ground probes). Other probes (e.g., signal probes) will need to be effectively insulated from the guide plates. One approach for providing this insulation is considered in US 2015/0015289 by the present inventor and hereby incorporated by reference in its entirety. Briefly, the idea here is to use multipath probes having signal and secondary electrically conductive paths that are insulated from each other. The secondary conductive path of the probe can make electrical contact with the guide plates while the signal path remains insulated from the guide plates.

DETAILED DESCRIPTION

Figure 1A:
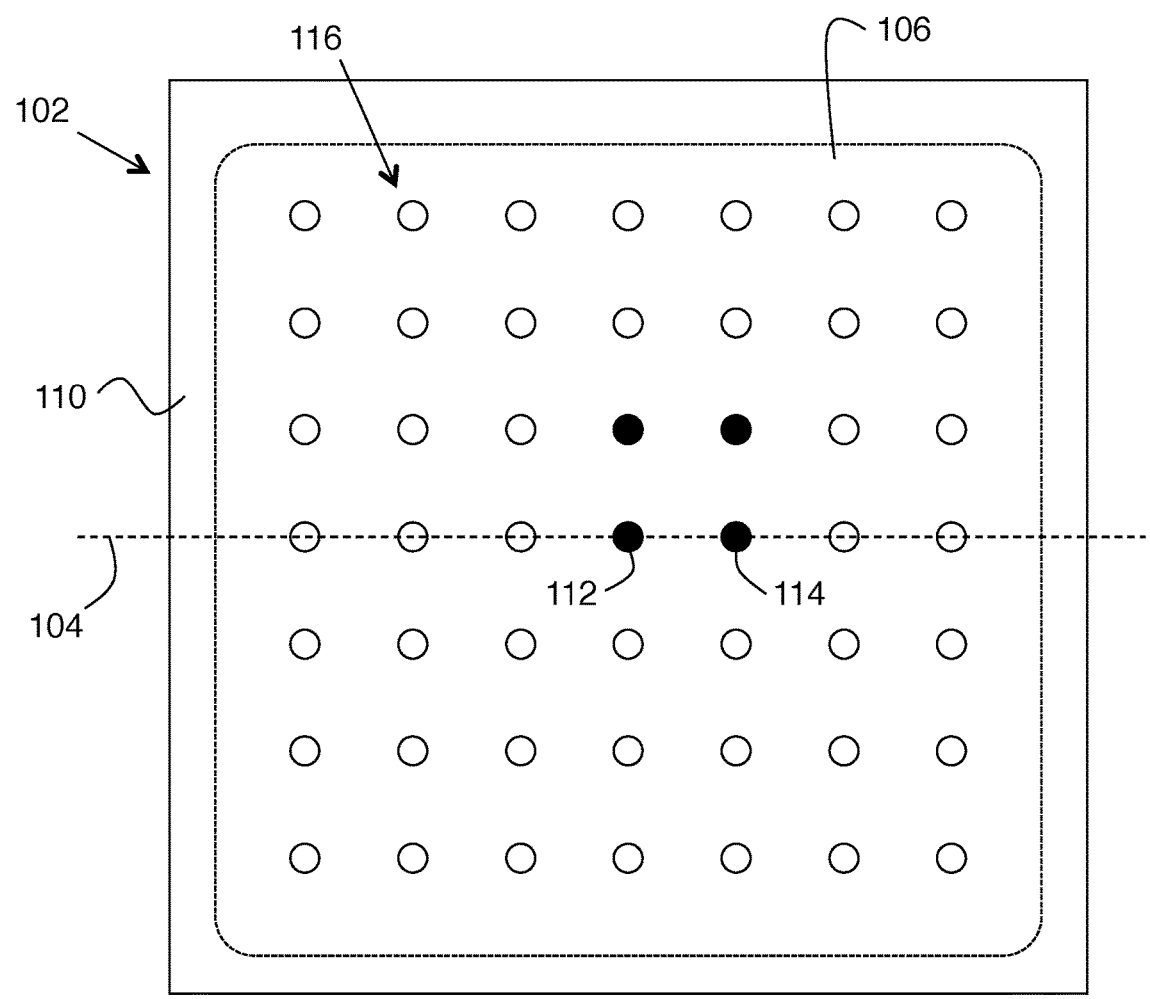
FIGS. 1A-B show a prior art probe array.
Figure 1B:
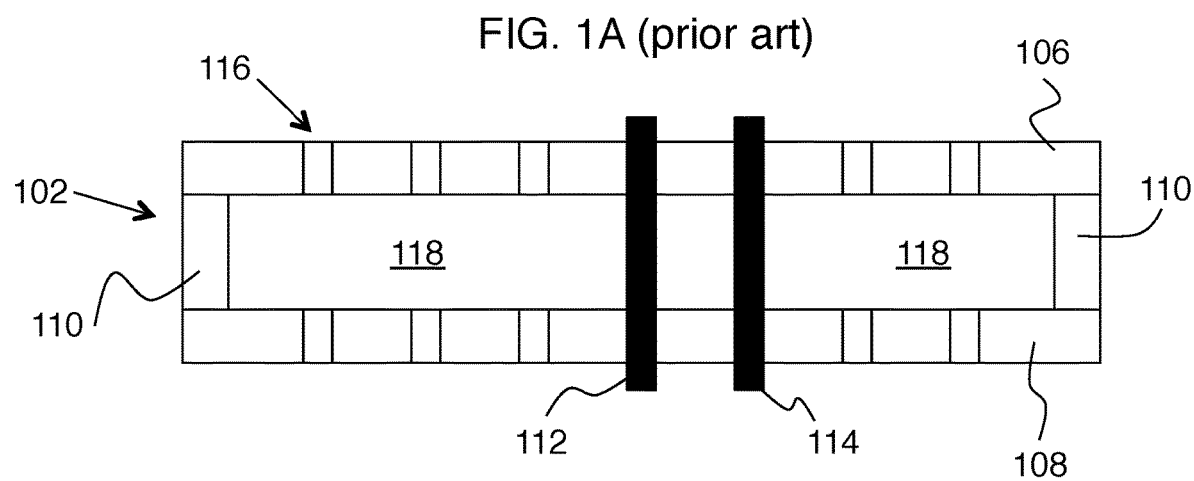

To better appreciate the present invention, it is helpful to consider a typical prior art vertical probe array 102 as shown on FIGS. 1A-B. Here FIG. 1A is a top view and FIG. 1B is a side view along line 104 of FIG. 1A. This example includes a top guide plate 106, a bottom guide plate 108, and a spacer 110 configured to support the guide plates. The guide plates have holes 116 for the probes, and two probes 112 and 114 are shown disposed in two of the holes. As seen on FIG. 1B, an air gap 118 separates the two guide plates over most of their area.

As indicated above, electrical crosstalk in a probe array of this type can be a problem, especially at frequencies of 1 GHz and above. In this example, probes 112 and 114 in close proximity to each other can experience undesirable crosstalk. Many RF devices have very strict specifications for crosstalk between signals during test that are hard to achieve for typical vertical probe heads where the pins are all in a common cavity between the two guide plates and spaced apart by tens to hundreds of microns. Typical crosstalk requirements are −30 db or more. Coupling between the probes, both capacitive and inductive, leads to signals appearing on probes that are due to this coupling, rather than being a measure of the crosstalk through the device itself which is what the test is looking to quantify. This crosstalk will typically limit performance to −20 db or so in the regions of measurement interest. By fashioning pockets in the metal carrier used to hold the guide plates, and positioning sensitive signal pins such that a metal wall is between these signal probes, better isolation can be achieved between them. This method typically provides 10 db or greater additional isolation, which can make the difference between whether the probe card using the head will meet the customer requirement or not.

Figure 2A:
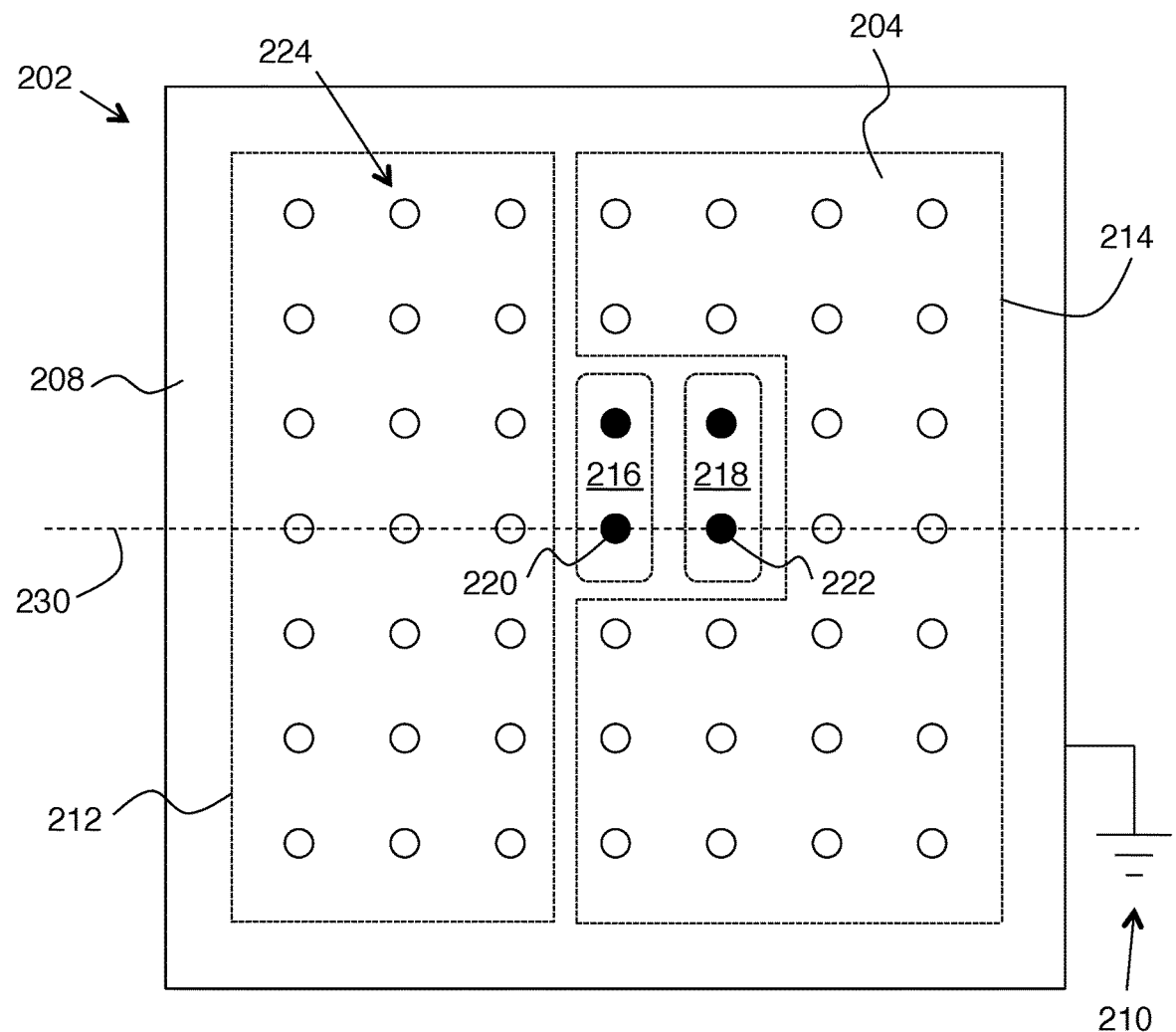
FIGS. 2A-B show a probe array according to an embodiment of the invention.
Figure 2B:
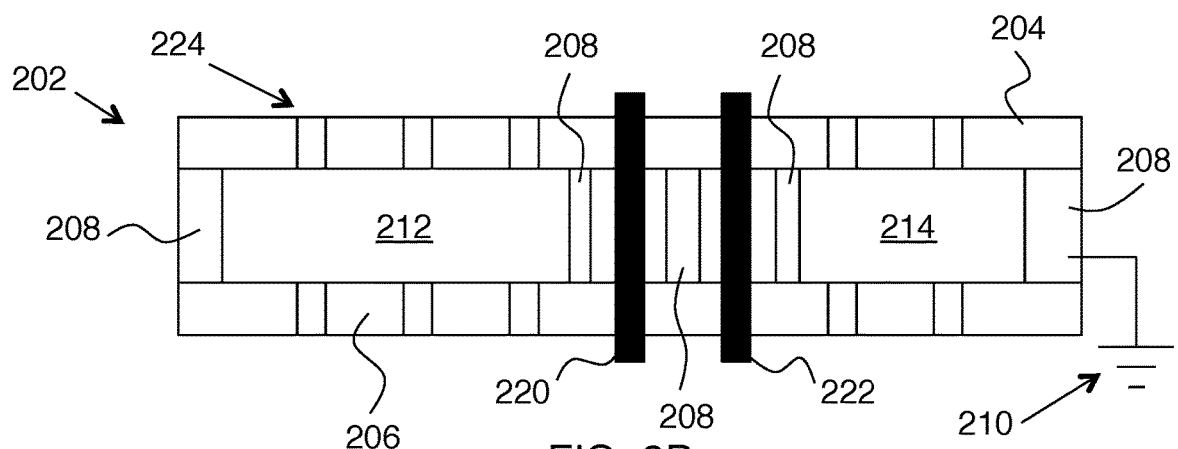

FIGS. 2A-B show a probe array according to an embodiment of the invention. Here vertical probe array 202 includes a first guide plate 204, a second guide plate 206, and two or more vertical probes (here referenced as 220 and 222). Each of the vertical probes is configured to pass through corresponding holes 224 in the first and second guide plates. A metal carrier 208 is disposed between the first and second guide plates. The metal carrier includes two or more pockets extending between the first and second guide plates, wherein the vertical probes are disposed in the two or more pockets. Here the pockets are air gaps between the guide plates that are laterally separated from each other by the metal carrier. In this example, the pockets are 212 (large pocket on the left), 214 (large pocket on the right), 216 (small pocket in the center) and 218 (small pocket to the right of pocket 216). The pockets are shown with dashed lines on FIG. 2A because they would not be visible in a top view. Metal carrier 208 is grounded (210), which improves electrical isolation between probes in different pockets by creating a continuous ground shield between the probes. In this example, crosstalk between probes 220 and 222 is reduced because they are in different pockets.

The first and second guide plates can be electrically insulating or they can be electrically conductive. In cases where the guide plates are electrically conductive, further measures are needed to provide for signal transmission in the probe array as described in greater detail below.

Figure 3:
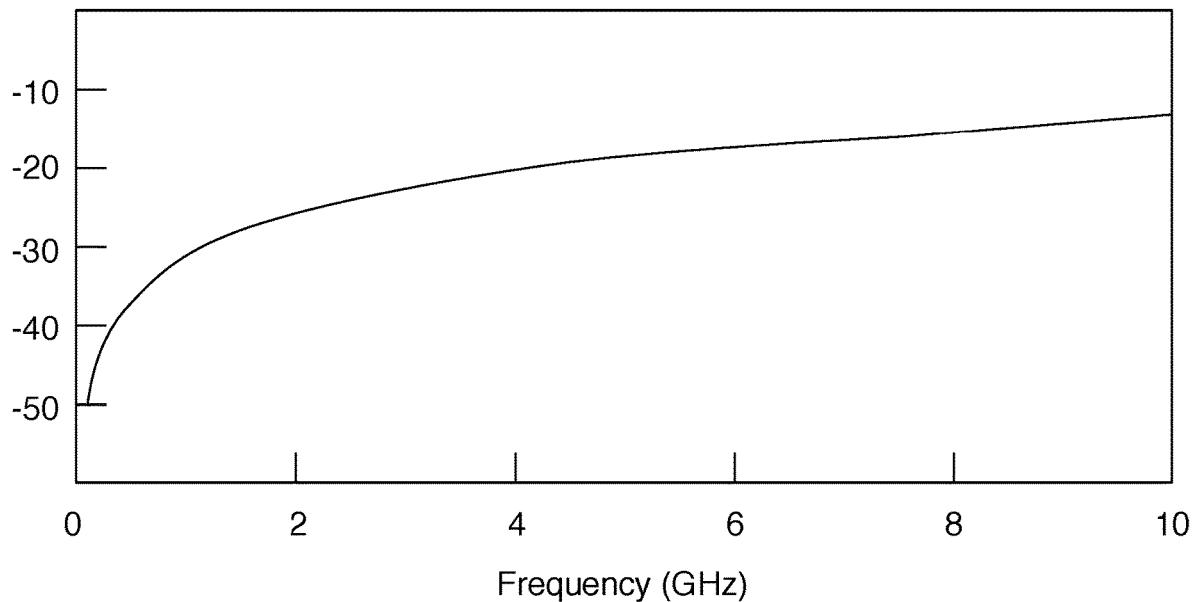
FIG. 3 shows modeled crosstalk results for a conventional probe array.
Figure 4:
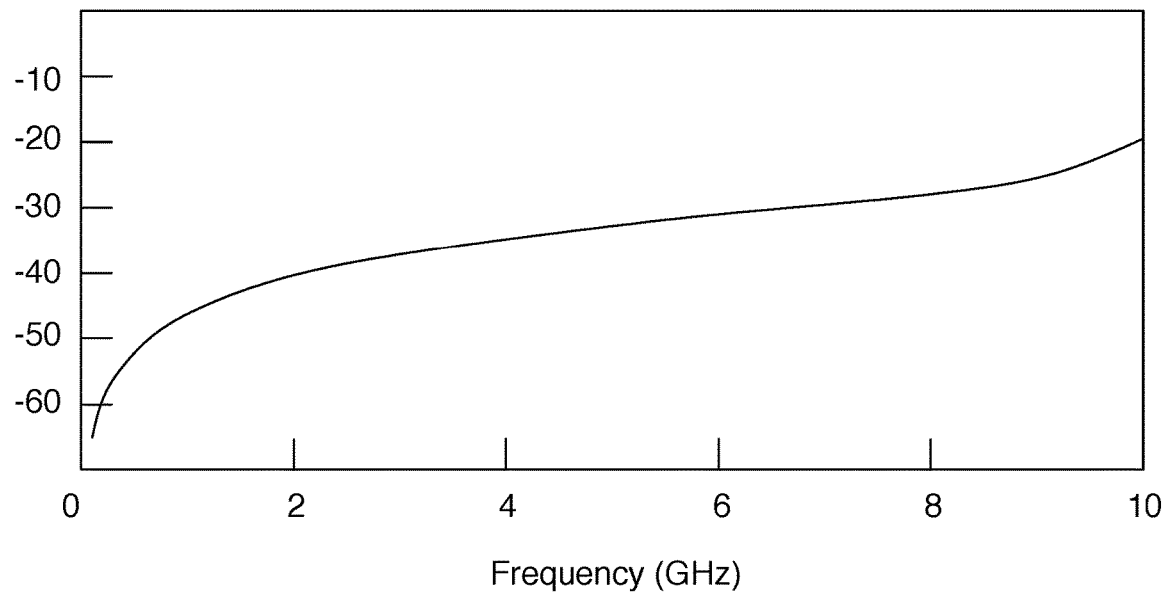
FIG. 4 shows modeled crosstalk results for a probe array according to an embodiment of the invention.

FIG. 3 shows modeled crosstalk results for a conventional probe array. FIG. 4 shows modeled crosstalk results for a probe array according to an embodiment of the invention that is otherwise similar to the probe array of FIG. 3. As can be seen when comparing FIG. 4 to FIG. 3, use of the pockets has provided between 10 and 15 db of reduction in crosstalk for the same pin layout. Although simple slots are shown, more complicated geometries may be used when pin layouts dictate that the pockets should be angled, dogleg, or other polyhedral shapes. Although two slots are shown, multiple pockets may be used if desired. Although shown with generic probes and metal guide plates, the same approach will work for non-metal guide plate structures and vertical probe pins other than springs probes such as other MEMS (Micro-Electrical-Mechanical Systems) pins or stamped wire pins used in typical Cobra® cards. Preferably, probe to probe crosstalk from one pocket of the metal carrier to another pocket of the metal carrier is reduced by 10 dB or more in a predetermined frequency range.

Figure 5:
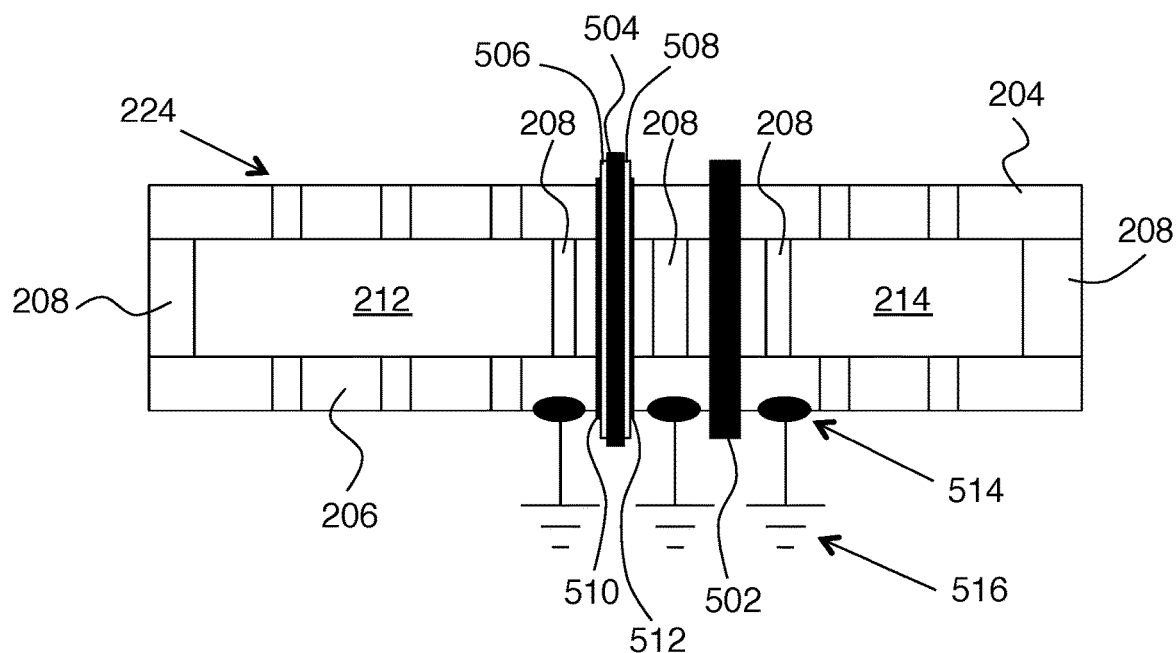
FIG. 5 shows a second embodiment of the invention.

FIG. 5 shows a second embodiment of the invention. This example is similar to the example of FIG. 2B except that ground connections 514 are explicitly shown on guide plate 206, which is taken to be electrically conductive in this example. Correct operation for shielding requires that the carrier be attached to ground for signal return currents as close as practical to the signal probes that need to be isolated. One, two or more ground connections may be used spaced in close proximity to where the signal pins contact the device under test. Fuzzbuttons are one type of demountable connection that can be used. Also usable for this would be MEMs pins dedicated to this function or pogo pins. Preferably a ground connection of the metal carrier is located within 1 mm of a signal probe being isolated from other probes by the metal carrier.

Use of conductive guide plates as in the example of FIG. 5 can improve shielding and grounding, but requires special measures to prevent the probes in the probe array from all being shorted together. Some probes in the probe array are ground probes, and can be permitted to make electrical contact to the guide plates. 502 on FIG. 5 is an example of a ground probe. Other probes in the probe array are signal probes that need to provide a signal path for electrical signals that is insulated from the first and second guide plates. Such signal probes can be multipath probes that also provide a ground path that is electrically connected to the first and second guide plates. The left probe on FIG. 5 is an example of a multipath probe. Here 504 is the signal path, 506 and 508 are electrical insulators, and 510 and 512 are the ground path. Further details relating to such multipath probes are described in the above-referenced US 2015/0015289 application by the present inventor.

Figure 6A:
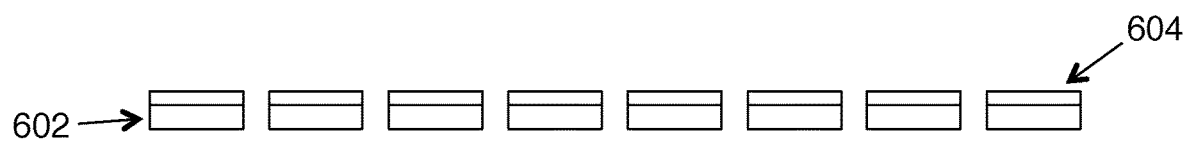
FIGS. 6A-B show two options for providing conductive guide plates.
Figure 6B:
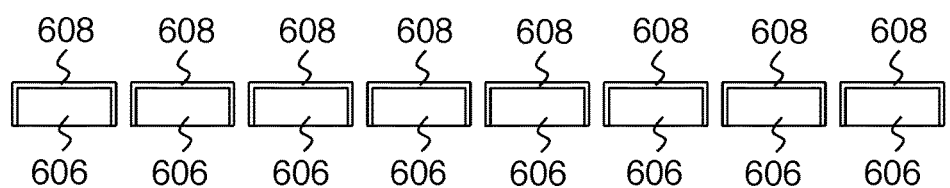

In some cases it is preferred to provide conductive guide plates by combining metal with an insulating substrate. FIG. 6A shows a first option for providing such a structure, where insulating substrate 602 and metal layer 604 are separately fabricated, then bonded together. FIG. 6B shows a second option for providing such a structure, where metal layer 608 is deposited on insulating substrate 606.

Fabrication of a metal carrier for a probe array having pockets as described above can be accomplished with conventional micro-fabrication techniques or with conventional machining techniques. Electrical connection between the metal carrier and conductive guide plates can be accomplished using conductive adhesives or the like.

The invention claimed is:

1. A vertical probe array configured to test an electrical device, the vertical probe array comprising:
   a first guide plate;
   a second guide plate;
   two or more vertical probes, each of the vertical probes configured to pass through corresponding holes in the first and second guide plates, wherein the vertical probes are slidably disposed in the holes of the first and second guide plates, whereby the vertical probes are not affixed to the first guide plate and whereby the vertical probes are not affixed to the second guide plate;
   a metal carrier disposed between the first and second guide plates;
   wherein the metal carrier includes two or more pockets extending between the first and second guide plates, wherein the vertical probes are disposed in the two or more pockets;
   wherein the metal carrier is grounded, whereby electrical isolation between probes in different pockets is improved.

2. The vertical probe array of claim 1, wherein the first and second guide plates are electrically insulating.

3. The vertical probe array of claim 1, wherein the first and second guide plates are electrically conductive.

4. The vertical probe array of claim 3, wherein the first and second guide plates include metal layers deposited on an insulating substrate.

5. The vertical probe array of claim 3, wherein the first and second guide plates include metal layers bonded to an insulating substrate.

6. The vertical probe array of claim 3, wherein at least one of the vertical probes is one or more signal probes that are electrically insulated from the first and second guide plates.

7. The vertical probe array of claim 6, wherein the signal probes include at least one multipath probe having a signal path for electrical signals that is insulated from the first and second guide plates and a ground path that is electrically connected to the first and second guide plates, wherein the signal path and the ground path are both part of the multipath probe.

8. The vertical probe array of claim 1, wherein a ground connection of the metal carrier is located within 1 mm of a signal probe being isolated from other probes by the metal carrier.

9. The vertical probe array of claim 1, wherein probe to probe crosstalk from one pocket of the metal carrier to another pocket of the metal carrier is reduced by 10 dB or more in a predetermined frequency range.

* * * * *